United States Patent [19]
Ono et al.

[11] Patent Number: 5,440,397
[45] Date of Patent: Aug. 8, 1995

[54] APPARATUS AND METHOD FOR EXPOSURE

[75] Inventors: Kazuya Ono; Yukio Yamane, both of Yokohama, Japan

[73] Assignee: Canon Kabushiki Kaisha, Tokyo, Japan

[21] Appl. No.: 356,776

[22] Filed: Dec. 12, 1994

Related U.S. Application Data

[63] Continuation of Ser. No. 14,247, Feb. 5, 1993, abandoned.

[30] Foreign Application Priority Data

Feb. 18, 1992 [JP] Japan ................................. 4-060952

[51] Int. Cl.$^6$ ...................... G03B 27/10; G03B 27/53; G01N 21/86
[52] U.S. Cl. .................................. 356/401; 356/358; 250/548; 250/224
[58] Field of Search ................ 356/401, 358; 250/548, 250/22.4

[56] References Cited

U.S. PATENT DOCUMENTS

| | | | |
|---|---|---|---|
| 4,676,630 | 6/1987 | Matsushita et al. | 355/53 |
| 4,677,301 | 6/1987 | Tanimoto et al. | 250/234 |
| 4,803,524 | 2/1989 | Ohno et al. | 356/401 |
| 4,869,481 | 9/1989 | Yabu et al. | 269/21 |
| 4,908,656 | 3/1990 | Suwa et al. | 356/401 |
| 5,003,342 | 3/1991 | Nishi | 356/401 |

Primary Examiner—Robert P. Limanek
Assistant Examiner—Alexander Oscar Williams
Attorney, Agent, or Firm—Fitzpatrick, Cella, Harper & Scinto

[57] ABSTRACT

An exposure apparatus and an exposure method capable of performing high-precision superposition exposure by preventing the thermal deformation of a position measurement target, for controlling positioning of a moved member, from influencing the correction of an error in the positioning of the moved member. The exposure apparatus projects an image of a pattern, formed on a mask, onto a photosensitive substrate through a projection optical system. A stage, on which the photosensitive substrate is mounted, is movable in at least X-axis and Y-axis directions in an imaging plane of the projection optical system. Position measuring devices measure the position of the stage in each of the two directions and are disposed so that the Abbe error is substantially zero with respect to the position at which the substrate is exposed to the pattern image. A pattern detector is disposed on a measuring axis of the position measuring devices with respect to one of the two directions to optically detect an alignment pattern formed on the photosensitive substrate. A rotation measuring device measures the amount of rotation of a measurement target of the position measuring devices with respect to the X- and Y-axis directions, and a controller controls the position and the amount of rotation of the stage on the basis of the amount of rotation measured by the rotation measuring device, the positions measured by the position measuring devices, and information regarding the position of the pattern detected by the pattern detector.

5 Claims, 5 Drawing Sheets

APPARATUS AND METHOD FOR EXPOSURE

This application is a continuation of prior application, Ser. No. 08/014,247 filed Feb. 5, 1993, now abandoned.

BACKGROUND OF THE INVENTION

1. Field of the Invention

This invention relates to an exposure apparatus for manufacturing a semiconductor integrated circuit and, more particularly, to a mechanism for controlling the position of a stage on which a photosensitive substrate, formed of a semiconductor wafer or the like, is placed, and where the stage is moved two-dimensionally.

2. Description of the Related Art

A step and repeat type of reduction-projection exposure apparatus (stepper) is widely used for a lithography process in the manufacturing of semiconductor integrated circuits. There are two types of alignment systems for positioning between a projected image of a circuit pattern formed on a reticle, and a rotating pattern (hereinafter referred to as a "chip") previously formed on a photosensitive substrate (hereinafter referred to as a "wafer") in this type of stepper. The first type is an on-axis alignment system for performing positioning by detecting a mark on the reticle and a mark on the wafer through a projection lens and the reticle. The second type is an off-axis alignment system for detecting only a mark on the wafer without detecting a mark on the reticle.

In a stepper having the off-axis alignment system, a mark detection reference position for the alignment system (hereinafter referred to as "alignment position") and a projected position of the projected image of the reticle circuit pattern (hereinafter referred to as "exposure position") differ from each other. Therefore, in the case of an apparatus, such as that shown in FIG. 5, having an alignment system 103, located on a measuring axis of one laser interferometer 105 and off a measuring axis of another laser interferometer 104, an alignment mark of a wafer 101 is detected by using the alignment system 103. The alignment position of the corresponding chip in the directions along X- and Y-axes is read from the laser interferometers 104 and 105 by measuring the extent of movement of mirrors 107 and 108, which are fixed on a stage 109. However, a measurement value detected in this manner includes an Abbe error, since the alignment position is not located on the measuring axis of the laser interferometer 104. According to the conventional method, the extent of movement of the mirror 108 is measured again by a uniaxial laser interferometer 106, the amount of rotation, i.e., the amount of yawing of the stage 109 is calculated in a controller (not shown) from the difference between measurement values obtained by the laser interferometers 105 and 106. The measurement value obtained by the laser interferometer 104 is corrected by using the amount of yawing that was calculated. The stage 109 is only moved through a base line (a relative positional relationship between the alignment position and the exposure position) on the basis of the corrected value. Also, when the wafer 101 is transported to a position below the projection lens, chip positioning is performed by considering the amount of rotation of the stage 109 so that the projected image of the circuit pattern and the chip is accurately superposed, and exposure is thereafter effected.

However, as shown in FIG. 6, if the perpendicularity between the mirrors 107 and 108 is changed by thermal deformation, or the like, of the stage 109 in the above-described conventional exposure apparatus, a positional error "e" corresponding to a change in the perpendicularity occurs as a base line error when the stage is moved from the alignment position to the exposure position. The circuit pattern superposition accuracy is thereby reduced.

SUMMARY OF THE INVENTION

In view of the above-described problem, an object of the present invention is to provide an exposure apparatus and an exposure method capable of performing high-precision superposition exposure by preventing thermal deformation or the like of a position measurement target which is for controlling the positioning of a moved member, from influencing the correction of an error in the positioning of the moved member.

To achieve this object, according to the present invention, there is provided an exposure apparatus comprising a top plate on which a wafer is placed, a measurement target fixed on the top plate, and which serves to measure a position in the X-axis direction, another measurement target fixed on the top plate, which serves to measure a position in the Y-axis direction, and a stage on which the wafer is mounted. The stage is movable in at least the X-axis and Y-axis directions in an imaging plane (XY plane) of a projection lens. The exposure apparatus further comprises position measuring means disposed so that the Abbe error is substantially zero with respect to an exposure position, and used to measure the position of the stage in each of the X-axis and Y-axis directions, and pattern detection means disposed on a measuring axis of the position measuring means in one of the X-axis and Y-axis directions to optically detect an alignment pattern formed on the wafer. The exposure apparatus also comprises rotation measuring means for measuring the amount of rotation of the measurement target of the position measuring means with respect to the other of the two directions, and control means for controlling the position in the X-axis and Y-axis directions and the attitude in a rotational direction of the stage. The position is controlled on the basis of the amount of rotation calculated by the rotation measuring means, the positions measured by the position measuring means in the X-axis and Y-axis directions, and the position of the pattern detected by the pattern detection means. The apparatus is controlled so that the measurement target measured by the rotation measuring means does not rotate. Occurrence of an error in base line correction is prevented even if the perpendicularity of the measurement target in the X-axis and Y-axis directions is changed, thereby enabling high-precision superposition exposure.

In accordance with the present invention, two measurement systems for measuring the amounts of movement in the X-axis and Y-axis directions, perpendicular to each other, are arranged so that the Abbe error is substantially zero. An alignment system is provided on a measuring axis of one of the measurement systems, and means for measuring the amount of rotation of a measurement target of the other measurement system is provided. A stage positioning control is performed according to the amount of rotation thereby measured. It is thereby possible to perform accurate base line correction and, hence, high-precision superposition exposure, even if the perpendicularity of the approximately perpendicular measurement targets of the measurement systems in the X-axis and Y-axis directions is changed.

According to one aspect of the present invention, an exposure apparatus which projects an image of a pattern, formed on a mask, onto a photosensitive substrate through a projection optical system, comprises a stage on which the photosensitive substrate is mounted, wherein the stage is movable in at least X-axis and Y-axis directions in an imaging plane of the projection optical system. The exposure apparatus further comprises position measuring means disposed so that Abbe error is substantially zero with respect to the position at which the photosensitive substrate is exposed to the pattern image by the projection optical system, wherein the position measuring means measures the position of the stage in each of the X-axis and Y-axis directions, and pattern detection means is disposed on a measuring axis of the position measuring means with respect to one of the X-axis and Y-axis directions, wherein the pattern detection means optically detects a position of an alignment pattern formed on the photosensitive substrate. The exposure apparatus also comprises rotation measuring means for measuring an amount of rotation of a measurement target of the position measuring means with respect to the other of the X-axis and Y-axis directions, and control means for controlling the position and the amount of rotation of the stage on a basis of the amount of rotation measured by the rotation measuring means, the positions measured by the position measuring means, and information regarding the position of the pattern detected by the pattern detection means.

According to another aspect of the present invention, an exposure method comprises the steps of placing a substrate on a stage, measuring the position of the stage in a first direction with a first mirror, capable of moving integrally with the stage at least in the first direction, and with a first laser interferometer, operable in association with the first mirror, measuring the position of the stage in a second direction with a second mirror, capable of moving integrally with the stage at least in the second direction, and with a second laser interferometer, operable in association with the second mirror, wherein measuring axes of the first and second laser interferometers intersect at an exposure position, detecting a pattern on the substrate with pattern detection means positioned on the measuring optical axis of the first laser interferometer, controlling the movement of the stage on the basis of the detection of the pattern by measuring the positions of the stage in the first and second directions with the first and second laser interferometers, and by measuring an error in the rotation of the stage through the second laser interferometer and a third laser interferometer, which both operate in association with the second mirror, and transferring a pattern on an original plate onto the substrate.

According to yet another aspect of the present invention, a method of manufacturing a semiconductor device comprises the steps of placing a semiconductor substrate on a stage, measuring the position of the stage in a first direction with a first mirror, capable of moving integrally with the stage at least in the first direction, and with a first laser interferometer, operable in association with the first mirror, measuring the position of the stage in a second direction with a second mirror, capable of moving integrally with the stage at least in the second direction, and with a second laser interferometer, operable in association with the second mirror, wherein measuring axes of the first and second laser interferometers intersect in an exposure position, detecting a pattern on the semiconductor substrate with pattern detection means positioned on the measuring optical axis of the first laser interferometer, controlling the movement of the stage on a basis of the detection of the pattern by measuring the positions of the stage in the first and second directions with the first and second laser interferometers, and by measuring an error in the rotation of the stage through the second laser interferometer in a third laser interferometer, which both operate in association with the second mirror, and transferring a pattern on an original plate onto the semiconductor substrate to advance the semiconductor device manufacturing process.

DESCRIPTION OF THE PREFERRED EMBODIMENTS

Figure 1:
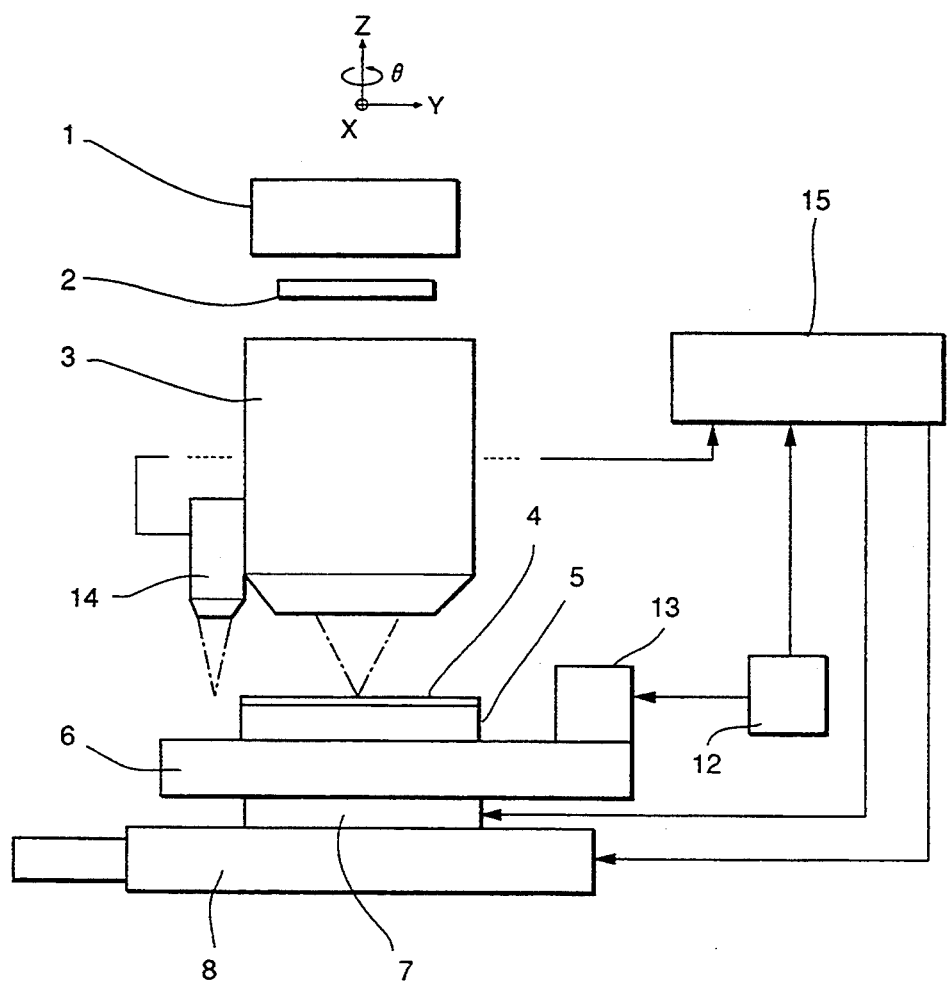
FIG. 1 is a schematic diagram of the construction of an exposure apparatus in accordance with a first embodiment of the present invention.
Figure 2:
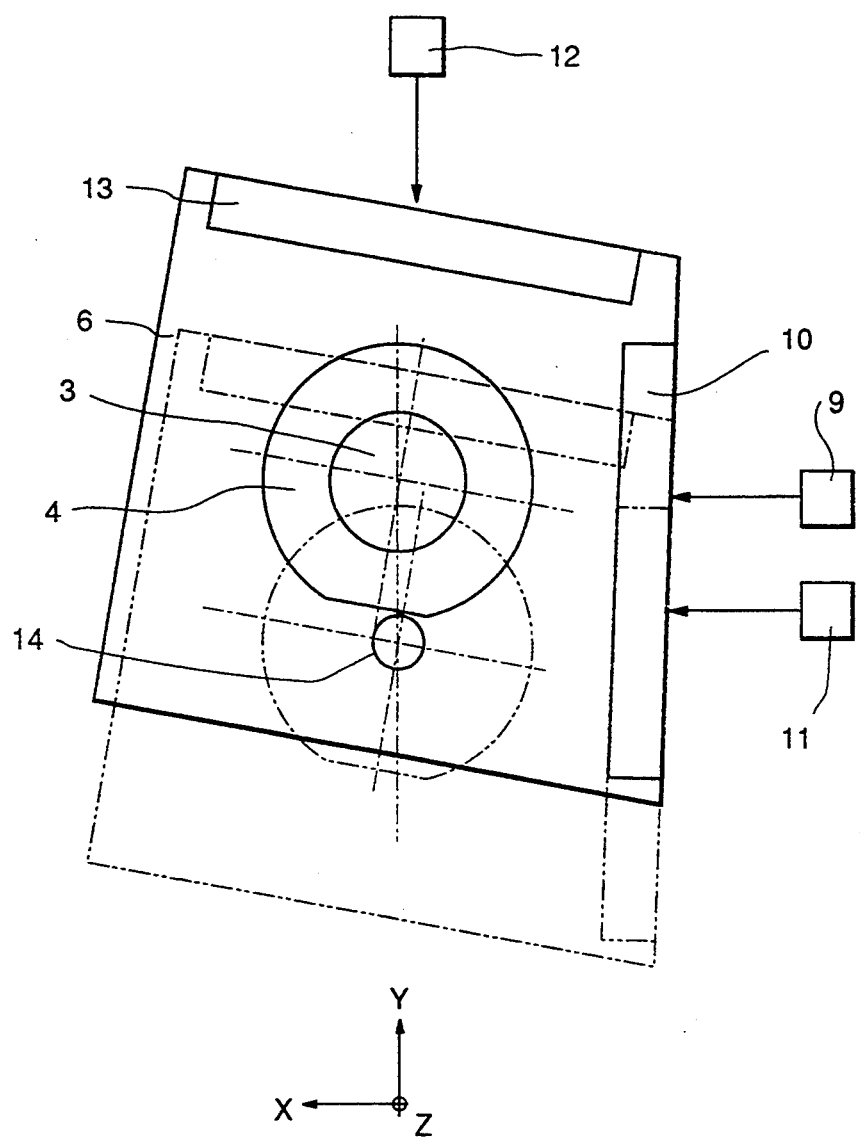
FIG. 2 is plan view of an essential portion of the first embodiment, illustrating the operation thereof.

FIG. 1 is a schematic diagram of the construction of a stepper arranged in accordance with the first embodiment of the present invention and used in the field of semiconductor device manufacture. FIG. 2 is a plan view of a stage portion of the stepper, illustrating the operation of the stepper.

Referring to FIG. 1, an illumination system 1 illuminates a pattern area of a reticle 2 with a uniform illuminance. An image of a circuit pattern formed on the reticle 2 is projected through a projection lens or a projection mirror lens 3 to a surface of a semiconductor wafer 4 to which a resist has been applied. The image is projected at one time or in a scanning manner and the circuit pattern is thereby transferred onto the wafer 4. This transfer process is practiced as part of a process of manufacturing a semiconductor device. The image of the circuit pattern is reduced to form a plurality of transferred images on the wafer 4. The wafer 4 is attracted to a chuck 5 by a vacuum and is fixed on a top plate 6 through the chuck 5. The top plate 6 is mounted on a θ stage 7 and is rotatable about the Z-axis. The θ stage 7 is mounted on an XY stage 8, which is two-dimensionally movable in an imaging plane (X-Y plane) of the projection lens 3.

As shown in FIG. 2, the extent of movement of the top plate 6 in the X-axis direction is measured by making laser light from a laser interferometer 9 travel to an X-axis mirror 10, which is fixed on the top plate 6. Similarly, the extent of movement of the top plate 6 in the Y-axis direction is measured by making laser light from a laser interferometer 12 travel to a Y-axis mirror 13, which is fixed on the top plate 6.

The measuring axes of the laser interferometers 9 and 12 intersect each other at right angles in the X-Y plane, and an optical center axis of the projection lens 3 passes through the point of intersection thereof. An alignment system 14 is disposed on the measuring axis of the laser interferometer 12.

Further, a laser interferometer 11 is disposed parallel to the laser interferometer 9 to also measure the extent of movement of the X-axis mirror 10. Measurement values obtained by the laser interferometers 9 and 11 are supplied to a controller 15 in a feedback manner. The controller 15 calculates the angle of rotation of the X-axis mirror 10 from the difference between the values from the laser interferometers 9 and 11, then the controller 15 sends commands to the $\theta$ stage 7 and the XY stage 8 to position the top plate 6 at the desired position, and performs a control such that the angle of rotation of the X-axis mirror 10 is not changed even if the perpendicularity of the two mirrors is changed.

By the alignment system 14, a shift of an alignment mark on the wafer 4 from an alignment reference position (0, YA) can be measured. In the controller 15, a base line (i.e., a relative positional relationship between the projection lens optical center position and the alignment reference position, (0, YA) in this case) is corrected by using equations XB=XE+XL, and YB=YA+YE+YL from the shift of the alignment mark from the alignment reference position (XE, YE) and corresponding measurement values (XL, YL) from the laser interferometers 9 and 12. The X-Y stage 8 is positioned by being moved by correction values (XB, YB) while the $\theta$ stage 7 is controlled so as to prevent the X-axis mirror 10 from rotating, thereby successively exposing the wafer.

Since the top plate 6 is rotated with respect to each wafer 4, chip rotation is caused. However, the pattern shift thereby caused is 5 nm or less at the worst, and this value is negligible. Also, the change in perpendicularity during exposure of one wafer occurs in a short interval of time. Therefore, the influence of this change is negligible.

As described above, even if the perpendicularity of the X-axis mirror and the Y-axis mirror is changed, the base line correction can be performed accurately so that the projected image of the circuit pattern of the reticle 2 and each chip on the wafer 4 coincide with each other correctly, thereby enabling high-precision superposition exposure.

Figure 3:
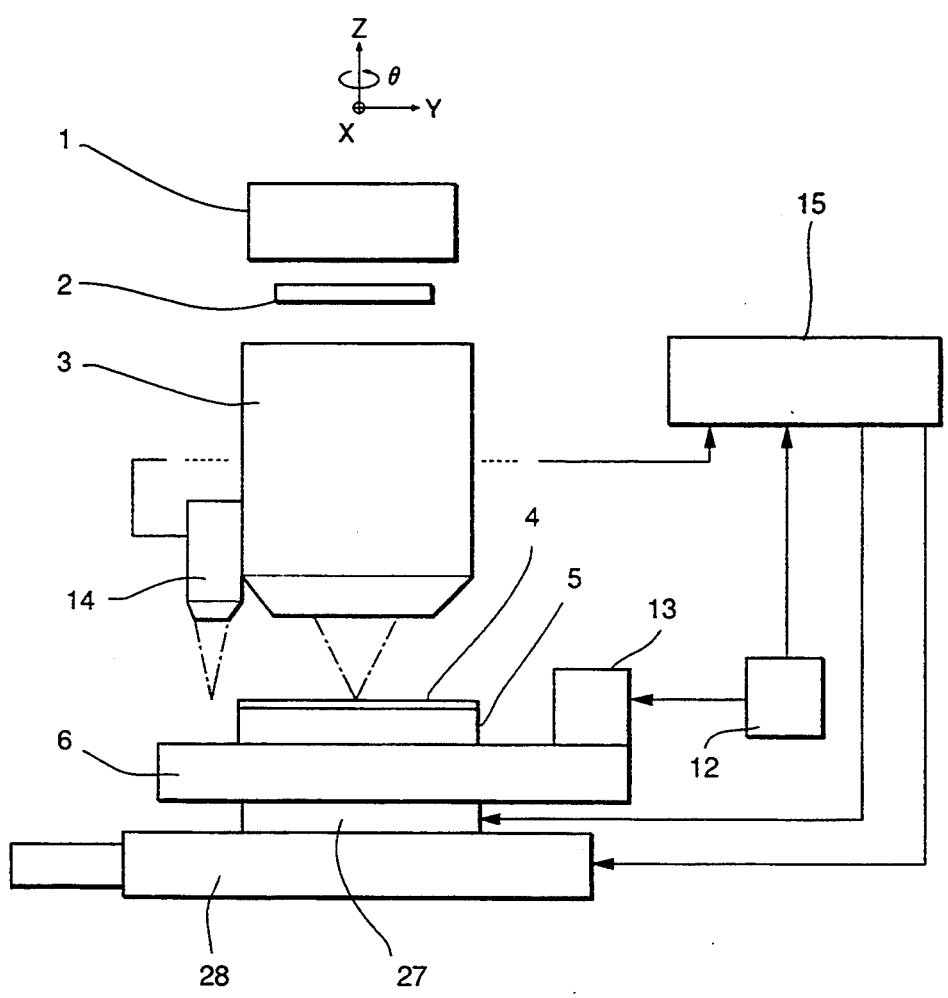
FIG. 3 is schematic diagram of the construction of an exposure apparatus in accordance with a second embodiment of the present invention.
Figure 4:
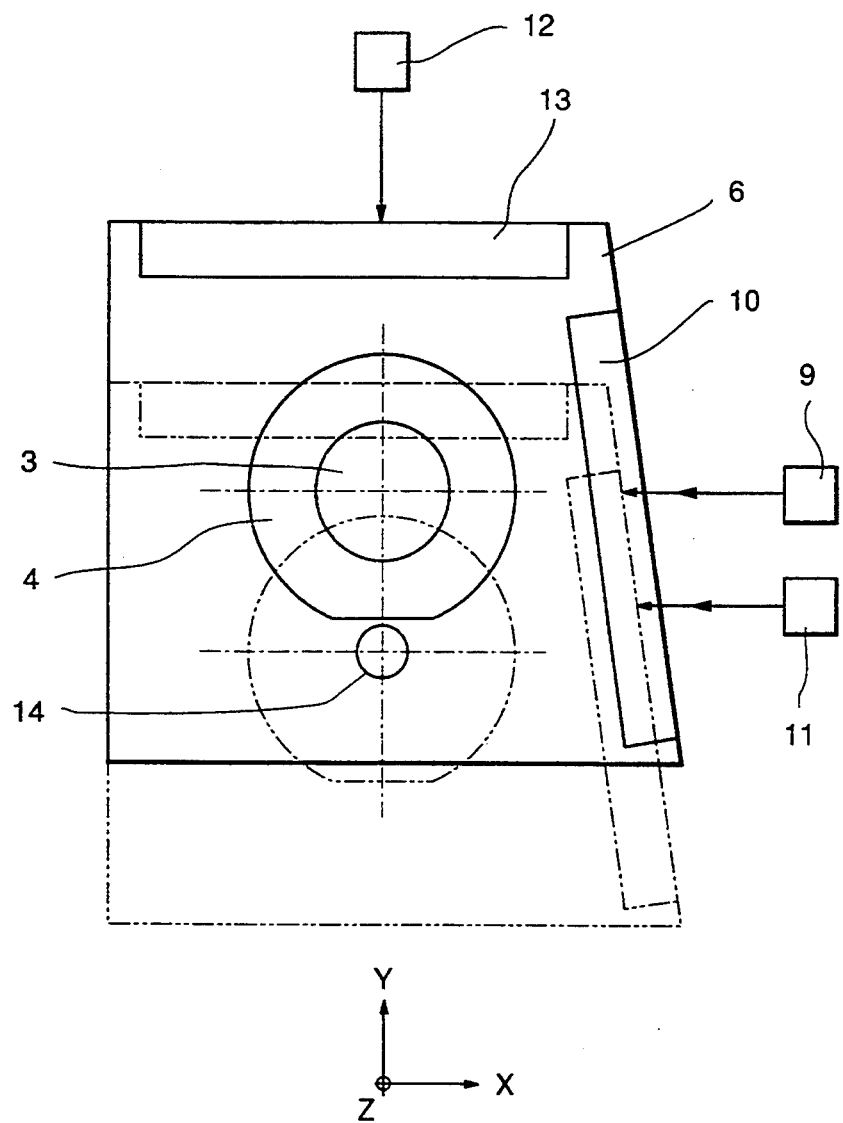
FIG. 4 is a plan view of an essential portion of the second embodiment illustrating the operation thereof.
Figure 5:
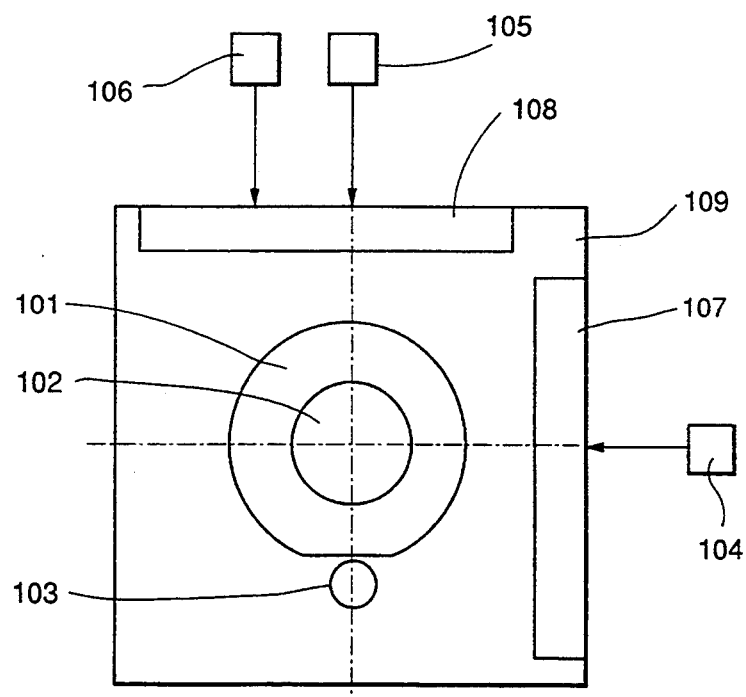
FIG. 5 is a plan view of an essential portion of a conventional exposure apparatus.
Figure 6:
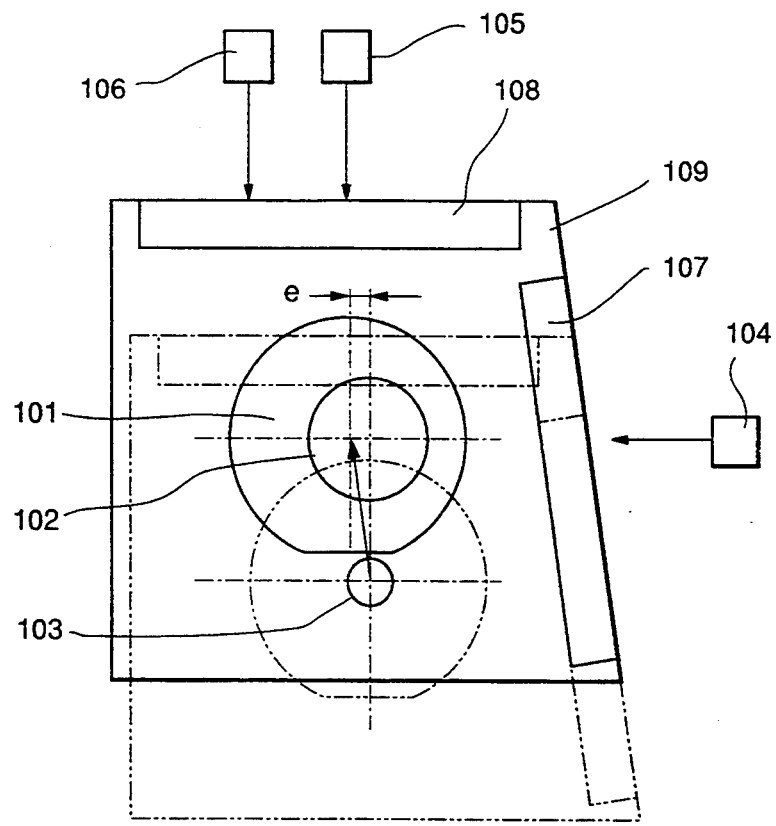
FIG. 6 is a plan view corresponding to FIG. 5, illustrating occurrence of an error in the conventional apparatus.

FIG. 3 is a schematic diagram of the construction of a stepper in accordance with the second embodiment of the present invention, and FIG. 4 is a plan view of a stage portion thereof, illustrating the operation of the stage.

Referring to FIG. 3, an illumination system 1 illuminates a pattern area of a reticle 2 with a uniform illuminance, as in the first embodiment. An image of a circuit pattern formed on the reticle 2 is projected through a projection lens 3 to a surface of a wafer 4 to which a resist has been applied. The wafer 4 is attracted to a chuck 5 by a vacuum and is fixed on a top plate 6 through the chuck 5. The top plate 6 is mounted on an X stage 27, which is mounted on a Y stage 28. Therefore the wafer 4 can be moved together with the top plate 6 in X-axis and Y-axis directions in an imaging plane (X-Y plane) of the projection lens 3. As shown in FIG. 4, the extent of movement of the top plate 6 in the X-axis direction is measured by making laser light from a laser interferometer 9 travel to an X-axis mirror 10 fixed on the top plate 6. Similarly, the extent of movement of the top plate 6 in the Y-axis direction is measured by making laser light from a laser interferometer 12 travel to a Y-axis mirror 13 fixed on the top plate 6.

The measuring axes of the laser interferometers 9 and 12 intersect each other at right angles in the X-Y plane, and an optical center axis of the projection lens 3 passes through the point of intersection thereof. An alignment system 14 is disposed on the measuring axis of the laser interferometer 12. Further, a laser interferometer 11 is disposed parallel to the laser interferometer 9 to also measure the extent of movement of the X-axis mirror 10. Measurement values obtained by the laser interferometers 9 and 11 are supplied to a controller 15 in a feedback manner. The controller 15 calculates the angle of rotation of the X-axis mirror 10 from the difference between the values from the laser interferometers 9 and 11. The controller 15 sends commands to the X stage 27 and the Y stage 28 by taking into consideration the angle of rotation to position the top plate 6 at the desired positions in the X- and Y-directions.

By the alignment system 14, a shift of an alignment mark on the wafer 4 from an alignment reference position (0, YA) can be measured. In the controller 15, a base line (i.e., a relative positional relationship between the projection lens optical center position and the alignment reference position, (0, YA) in this case) is corrected by using equations XB=XE+XL+$\theta$*YA, and YB=YA+YE+YL from the shift of the alignment mark from the alignment reference position (XE, YE), corresponding measurement values (XL, YL) from the laser interferometers 9 and 12 and the angle $\theta$ calculated from the difference between the values from the laser interferometers 9 and 11. The X stage 27 and the Y stage 28 are positioned by being moved by correction values (XB, YB), thereby successively exposing the wafer.

As described above, even if the perpendicularity of the X-axis mirror and the Y-axis mirror is changed, the base line correction can be performed accurately so that the projected image of the circuit pattern of the reticle 2 and each chip on the wafer 4 coincide with each other correctly, thereby enabling high-precision superposition exposure.

In each of the above-described embodiments, the angle of rotation of the X-axis mirror 10 is calculated from the difference between the values from the interferometers 9 and 11. Alternatively, the angle may be directly measured by using a differential interferometer or a collimator.

Except as otherwise disclosed herein, the various components shown in outline or in block form in the figures are individually well-known in their internal construction and operation and are not critical either to the making or using of this invention or to a description of the best mode of the invention.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and

What is claimed is:

1. An apparatus for transferring a pattern onto a substrate in a transfer region, said apparatus comprising:
    a chuck for holding the substrate;
    a reflecting member having first and second reflection surfaces;

a holding member for integrally holding said chuck and said reflecting member;

a detector for detecting a mark on the substrate in a detection region;

a first laser interferometer using said first reflection surface of said reflecting member, the detection region of said detector being positioned on a measuring optical axis of said first laser interferometer;

a second laser interferometer using said second reflection surface of said reflecting member, measuring axes of said first and second interferometers intersecting each other in the transfer region;

a third laser interferometer using said second reflection surface of said reflecting member, measuring axes of said second and third laser interferometers being substantially parallel to each other;

a stage mechanism for moving said holding member along a plane including first and second directions, on the basis of a mark detection signal from said detector, a measuring output of said first laser interferometer being used for detecting a position of said holding member in the first direction, and a measuring output of said second laser interferometer being used for detecting a position of said holding member in the second direction; and a rotation drive mechanism for driving said holding member along the plane in a rotational direction, said rotation drive mechanism controlling a position of said holding member in the rotational direction on the basis of the measuring outputs of said second and third laser interferometers when said holding member is being moved by said stage mechanism.

2. An apparatus according to claim 1, wherein said reflecting member comprises a first mirror including said first reflection surface and a second mirror including said second reflection surface.

3. An apparatus according to claim 1, further comprising a projection optical system for projecting the pattern onto the transfer region.

4. A method for transferring a pattern onto a substrate in a transfer region, said method comprising the steps of:

holding the substrate on a chuck;

integrally holding the chuck and a reflecting member having first and second reflection surfaces by a holding member;

using a first laser interferometer for measuring the first reflection surface and using second and third laser interferometers for measuring the second reflection surface;

detecting a mark on the substrate in a detection region by a detector, the detection region of the detector being positioned on a measuring optical axis of the first laser interferometer, measuring axes of the first and second interferometers intersecting each other in the transfer region and measuring axes of the second and third laser interferometers being substantially parallel to each other;

moving the holding member by a stage mechanism along a plane including first and second directions on the basis of a mark detection signal from the detector, a measuring output of the first laser interferometer being used for detecting a position of the holding member in the first direction, and a measuring output of the second laser interferometer being used for detecting a position of the holding member in the second direction;

controlling a position of the holding member by a rotation drive mechanism when the holding member is being moved by the stage mechanism, the holding member being moved by the rotation drive mechanism along the plane in a rotational direction on the basis of the measuring outputs of the second and third laser interferometers; and transferring the pattern onto the substrate within the transfer region.

5. A method according to claim 4, wherein said transferring step for transferring the pattern onto the substrate comprises performing a portion of a process for manufacturing a semiconductor apparatus.

* * * * *